United States Patent
Meyer et al.

(10) Patent No.: US 8,604,622 B2
(45) Date of Patent: Dec. 10, 2013

(54) SEMICONDUCTOR CHIP PACKAGE, SEMICONDUCTOR CHIP ASSEMBLY, AND METHOD FOR FABRICATING A DEVICE

(75) Inventors: Thorsten Meyer, Regensburg (DE); Markus Brunnbauer, Lappersdorf (DE); Jens Pohl, Bernhardswald (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/495,687

(22) Filed: Jun. 13, 2012

(65) Prior Publication Data

US 2012/0256315 A1 Oct. 11, 2012

Related U.S. Application Data

(62) Division of application No. 12/899,642, filed on Oct. 7, 2010, now Pat. No. 8,202,763, and a division of application No. 11/869,211, filed on Oct. 9, 2007, now Pat. No. 7,834,464.

(51) Int. Cl.
*H01L 23/52* (2006.01)
*H01L 23/48* (2006.01)
*H01L 29/40* (2006.01)

(52) U.S. Cl.
USPC ............. 257/777; 257/E25.013; 257/686; 257/723; 438/108; 438/109; 361/760

(58) Field of Classification Search
CPC ............... H01L 21/00; H01L 23/498
USPC .......... 257/E23.069, E25.018, 685, 686, 723, 257/738, 777, E25.013; 438/108, 109, 612, 438/614, 666; 361/760
See application file for complete search history.

(56) References Cited

U.S. PATENT DOCUMENTS

| | | | |
|---|---|---|---|
| 5,241,456 A | 8/1993 | Marcinkiewicz et al. | |
| 5,353,498 A | 10/1994 | Fillion et al. | |
| 6,181,002 B1 * | 1/2001 | Juso et al. | 257/686 |
| 6,271,469 B1 | 8/2001 | Ma et al. | |
| 6,452,279 B2 * | 9/2002 | Shimoda | 257/777 |
| 6,576,499 B2 | 6/2003 | Funaya | |
| 6,680,529 B2 * | 1/2004 | Chen et al. | 257/700 |
| 6,710,454 B1 * | 3/2004 | Boon | 257/777 |
| 6,764,880 B2 * | 7/2004 | Wu et al. | 438/123 |
| 6,784,530 B2 | 8/2004 | Sugaya et al. | |
| 6,841,418 B2 * | 1/2005 | Jeung et al. | 438/108 |

(Continued)

FOREIGN PATENT DOCUMENTS

CN 1064780 4/2001

OTHER PUBLICATIONS

Non-Final Office Action mailed Dec. 29, 2011 in U.S. Appl. No. 12/899,642.

(Continued)

*Primary Examiner* — Chris Chu
(74) *Attorney, Agent, or Firm* — Dicke, Billig & Czaja, PLLC

(57) ABSTRACT

A method for fabricating a device, a semiconductor chip package, and a semiconductor chip assembly is disclosed. One embodiment includes applying at least one semiconductor chip on a first form element. At least one element is applied on a second form element. A material is applied on the at least one semiconductor chip and on the at least one element.

9 Claims, 16 Drawing Sheets

(56) References Cited

U.S. PATENT DOCUMENTS

| | | | |
|---|---|---|---|
| 7,061,100 B2 | 6/2006 | Iwaki et al. | |
| 7,211,900 B2 * | 5/2007 | Shin et al | 257/777 |
| 7,294,587 B2 | 11/2007 | Asahi et al. | |
| 7,301,242 B2 * | 11/2007 | Teig | 257/777 |
| 7,321,164 B2 | 1/2008 | Hsu | |
| 7,341,890 B2 | 3/2008 | Ishimaru et al. | |
| 7,443,021 B2 * | 10/2008 | Nakatani | 257/700 |
| 7,479,408 B2 | 1/2009 | Lee | |
| 7,504,283 B2 | 3/2009 | Dunne | |
| 7,507,915 B2 | 3/2009 | Chang et al. | |
| 7,513,037 B2 * | 4/2009 | McCormack et al. | 29/852 |
| 7,514,636 B2 | 4/2009 | Sasaki | |
| 7,642,638 B2 * | 1/2010 | Kuah et al. | 257/686 |
| 7,763,964 B2 * | 7/2010 | Matsushima | 257/686 |
| 8,076,770 B2 * | 12/2011 | Kagaya et al. | 257/698 |
| 8,106,499 B2 * | 1/2012 | Camacho et al. | 257/686 |
| 8,247,896 B2 * | 8/2012 | Kagaya et al. | 257/686 |
| 8,274,148 B2 * | 9/2012 | Yanase et al. | 257/737 |
| 8,319,327 B2 * | 11/2012 | Suh | 257/686 |
| 2002/0053727 A1 * | 5/2002 | Kimura | 257/686 |
| 2004/0070064 A1 * | 4/2004 | Yamane et al. | 257/686 |
| 2004/0227258 A1 * | 11/2004 | Nakatani | 257/787 |
| 2005/0116337 A1 * | 6/2005 | Chua et al. | 257/723 |
| 2006/0027902 A1 * | 2/2006 | Ararao et al. | 257/676 |
| 2006/0050488 A1 | 3/2006 | Goodwin | |
| 2006/0050497 A1 | 3/2006 | Goodwin | |
| 2006/0183269 A1 | 8/2006 | Fuergut et al. | |
| 2006/0278972 A1 | 12/2006 | Bauer et al. | |
| 2007/0045796 A1 * | 3/2007 | Ye et al. | 257/678 |
| 2007/0084628 A1 * | 4/2007 | Chang et al. | 174/260 |
| 2007/0164418 A1 * | 7/2007 | Brunnbauer | 257/685 |
| 2007/0216004 A1 | 9/2007 | Brunnbauer et al. | |
| 2009/0091022 A1 | 4/2009 | Meyer et al. | |

OTHER PUBLICATIONS

Non-Final Office Action mailed Feb. 3, 2010 in U.S. Appl. No. 11/869,211.

* cited by examiner

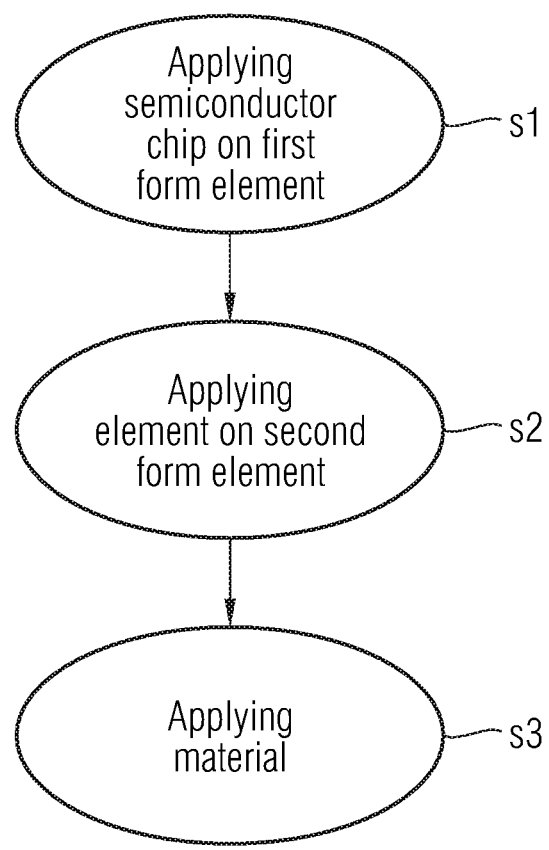

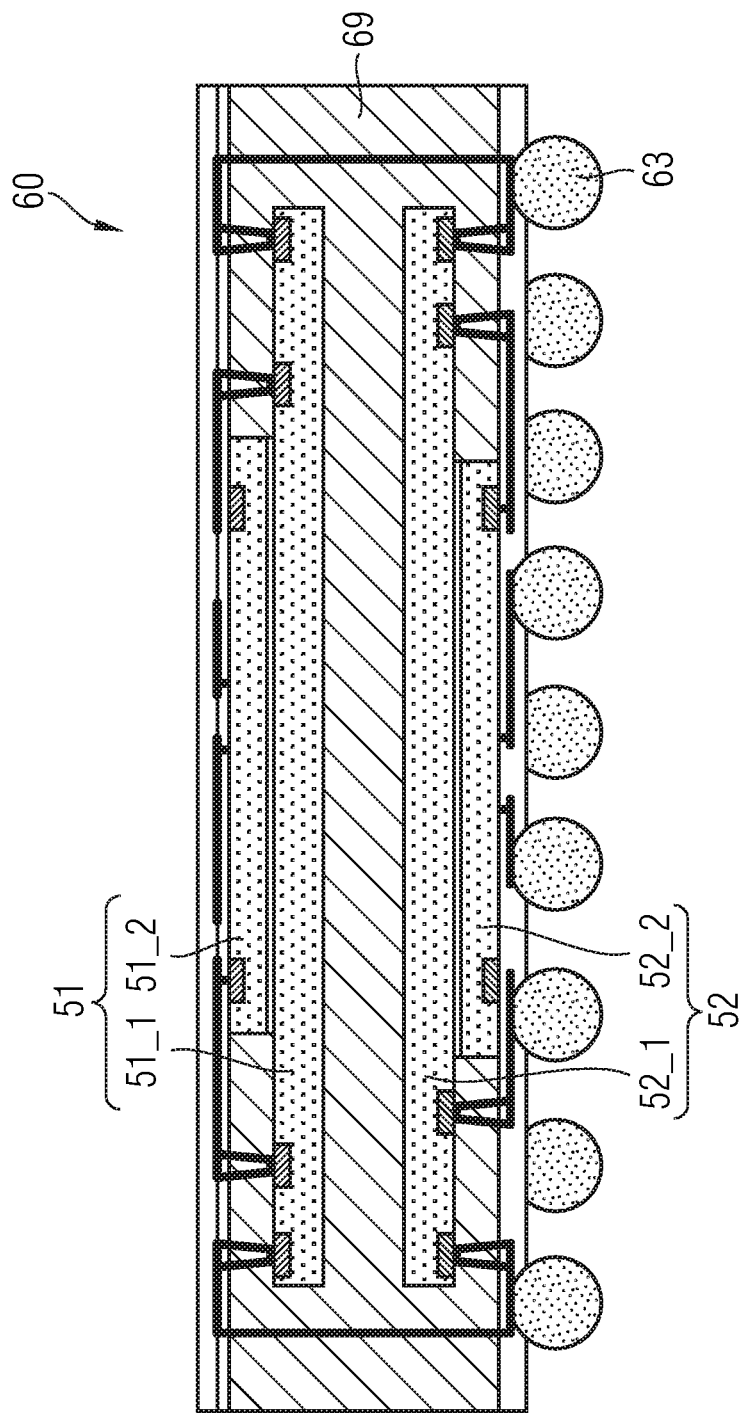

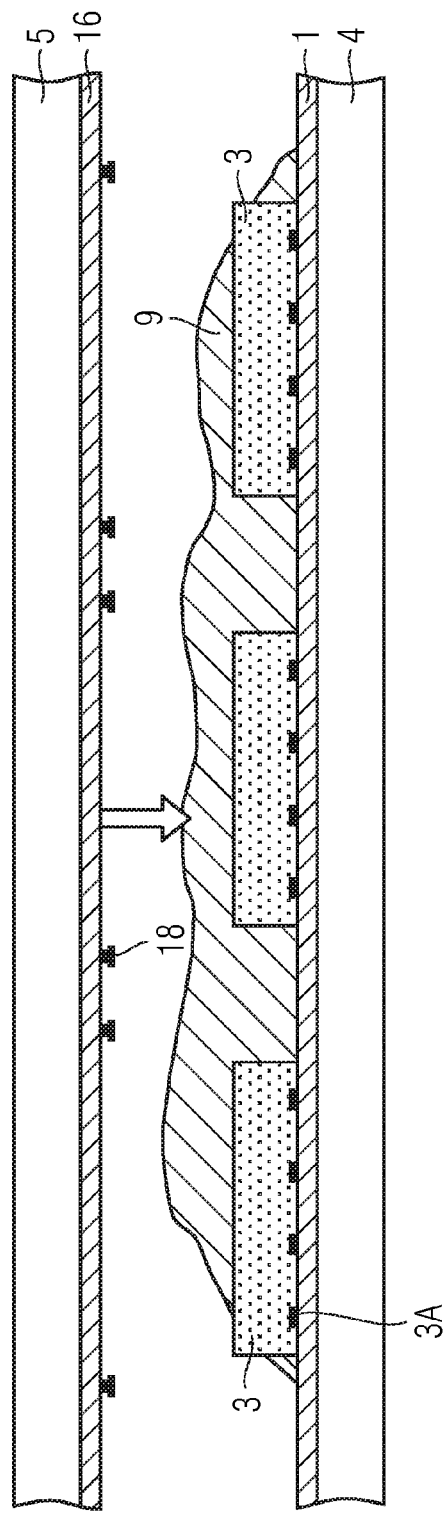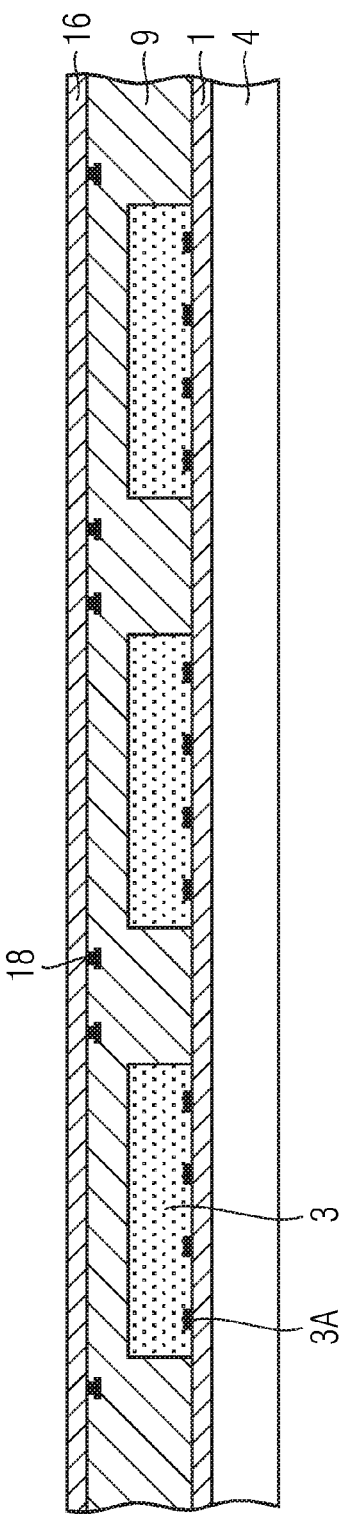

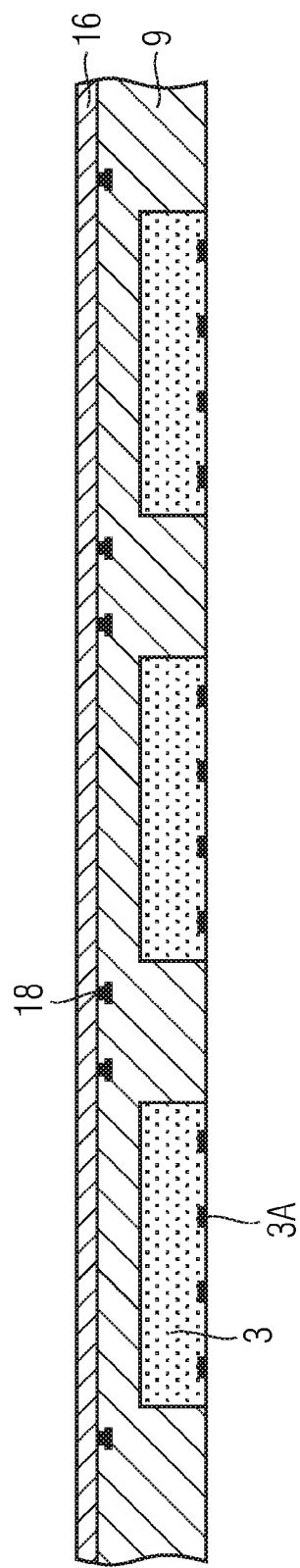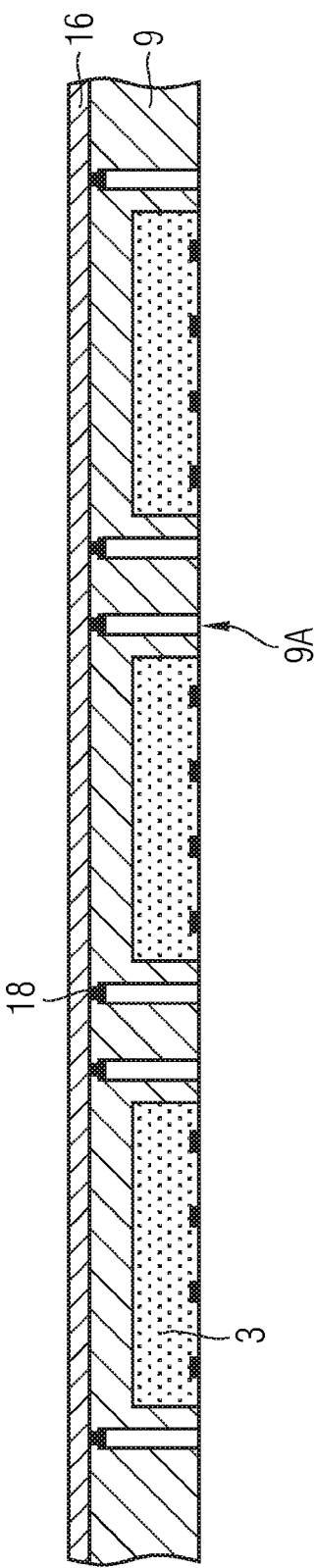

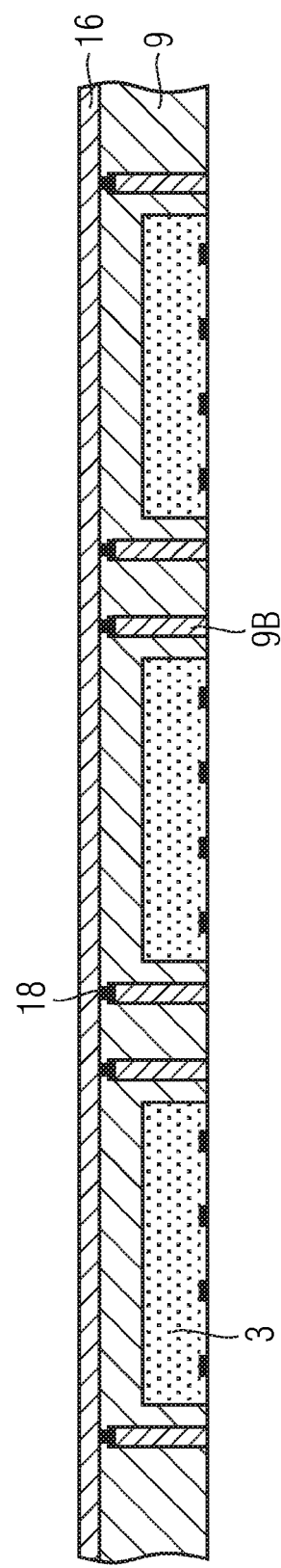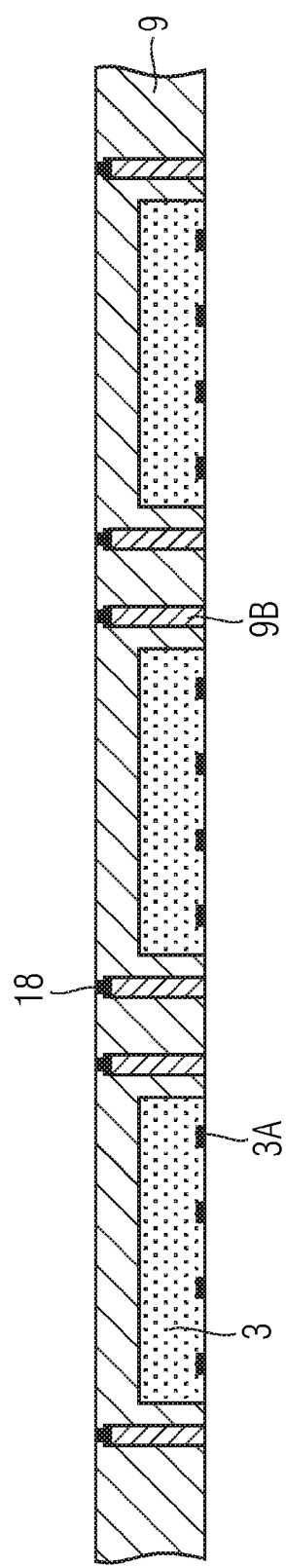

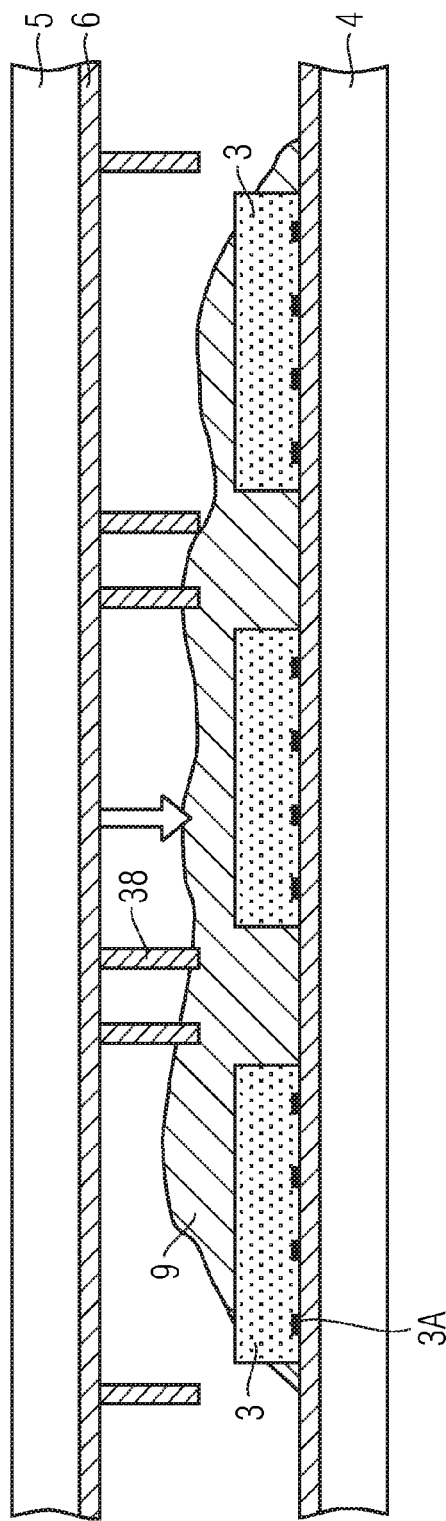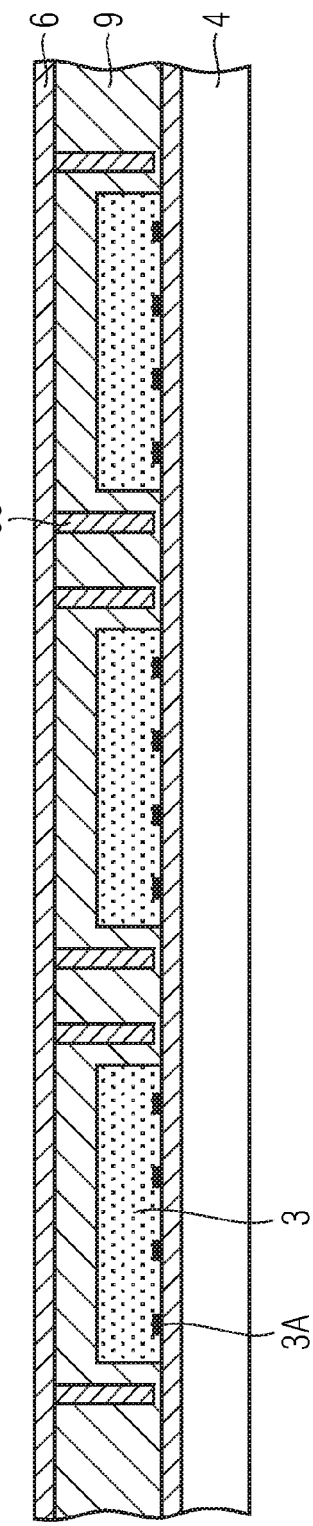

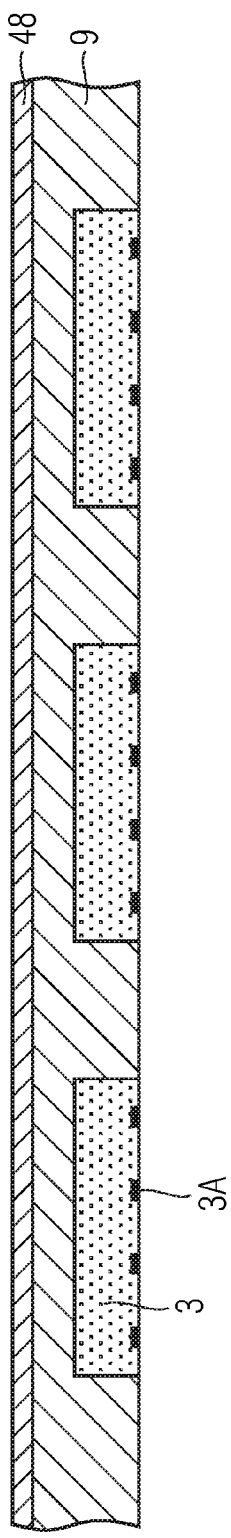
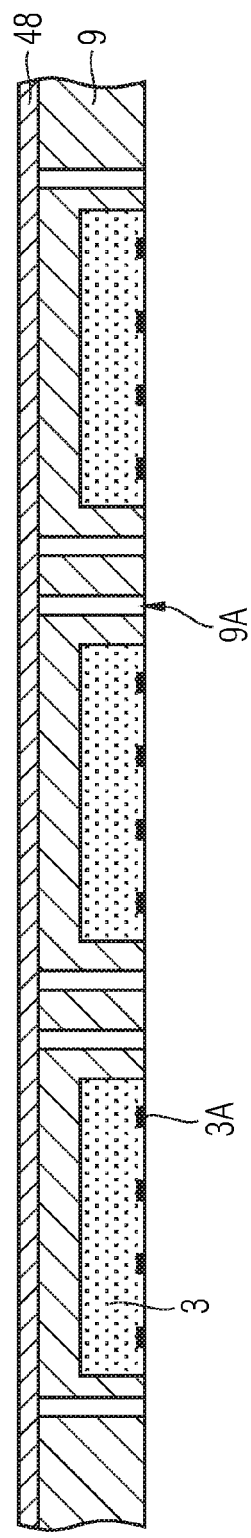
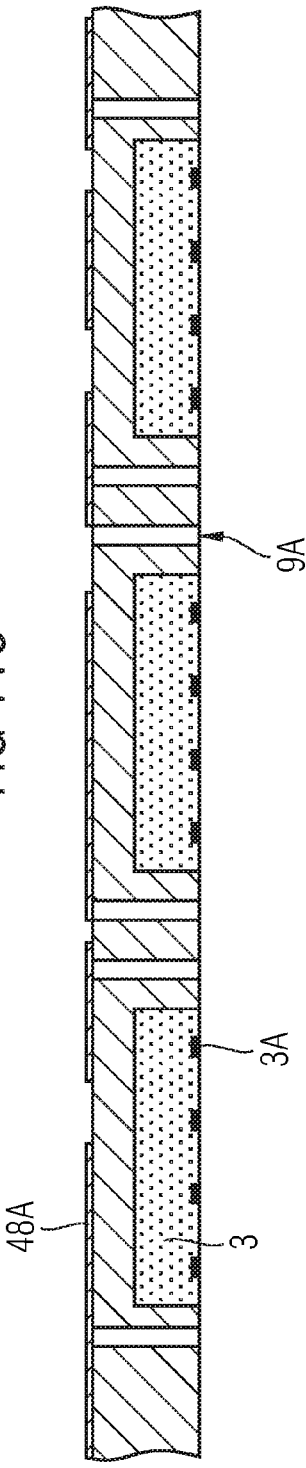

SEMICONDUCTOR CHIP PACKAGE, SEMICONDUCTOR CHIP ASSEMBLY, AND METHOD FOR FABRICATING A DEVICE

CROSS-REFERENCE TO RELATED APPLICATIONS

This Utility Patent Application is a divisional application of U.S. application Ser. 12/899,642, filed Oct. 7, 2010, which is a divisional application of U.S. application Ser. No. 11/869,211, filed Oct. 9, 2007, which are both herein incorporated herein by reference.

BACKGROUND

The present invention relates to a method for fabricating at least one device, a semiconductor chip package and a semiconductor chip assembly.

One of the challenges in semiconductor chip packaging technology is connecting of the contact pads of the semiconductor chip to external contact elements. A further challenge is the increase of functional density through chip or package stacking In chip stacking two or more semiconductor chips are stacked and housed in one chip package. When housing the semiconductor chips in the chip package, the contact pads of the semiconductor chips have to be connected to external contact elements of the chip package.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a flow diagram of an embodiment of a method for fabricating at least one device.

FIG. 8 illustrates a schematic cross-section representation of an embodiment of a semiconductor chip package.

FIGS. 9A-F illustrate schematic cross-section representations of intermediate products and devices together with process equipment for illustrating a further embodiment for fabricating at least one device.

FIGS. 10A, B illustrate schematic cross-section representations of intermediate products and devices together with process equipment for illustrating a further embodiment for fabricating at least one device.

FIGS. 11A-C illustrate schematic cross-section representations of intermediate products and devices for illustrating a further embodiment for fabricating at least one device.

DETAILED DESCRIPTION

Figure 2A:
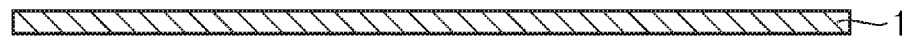
FIGS. 2A-I illustrate schematic cross-section representations of intermediate products and devices together with process equipment for illustrating a further embodiment of the embodiment as illustrated in FIG. 1.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The embodiments are now described with reference to the drawings, wherein like reference numerals are generally utilized to refer to like elements throughout. In the following description, for purposes of explanation, numerous specific details are set forth in order to provide a thorough understanding of one or more embodiments. It may be evident, however, to one skilled in the art that one or more embodiments may be practiced with a lesser degree of the specific details. In other instances, known structures and elements are illustrated in schematic form in order to facilitate describing one or more embodiments. The following description is therefore not to be taken in a limiting sense, and the scope is defined by the appended claims.

The embodiments of a method for fabricating at least one device, the embodiments of a method for fabricating a semiconductor chip assembly, and the embodiments of a semiconductor chip package may use various types of semiconductor chips or semiconductor substrates, among them logic integrated circuits, analog integrated circuits, mixed signal integrated circuits, sensor circuits, MEMS (Micro-Electro-Mechanical System), power integrated circuits, chips with integrated passives etc.

In several embodiments layers or layer stacks are applied to one another or materials are applied or deposited onto layers. It should be appreciated that any such terms as "applied" or "deposited" are meant to cover literally all kinds and techniques of applying layers onto each other. In one embodiment, they are meant to cover techniques in which layers are applied at once as a whole, like, for example, laminating techniques as well as techniques in which layers are deposited in a sequential manner, like, for example, sputtering, plating, molding, CVD, etc.

The semiconductor chip may include contact elements or contact pads on one or more of their outer surfaces wherein the contact elements serve for electrically contacting the semiconductor chips. The contact elements may be made from any electrical conducting material, e.g., from a metal as aluminum, gold, or copper, for example, or a metal alloy, or an electrically conducting organic material, or an electrically conducting semiconductor material.

In several embodiments the semiconductor chips may be or may become covered with a material layer. The material of the material layer can be any electrically insulating material like, for example, any kind of molding material, any kind of epoxy material, or any kind of resin material. In the process of covering the semiconductor chips with the material layer an "embedded wafer" can be fabricated. The embedded wafer can have the form of a normal semiconductor wafer and is also often called a "reconfigured wafer" or a "reconstituted wafer". However, it will be appreciated that the embedded wafer is not limited to the form and shape of a wafer but can have any size and shape and any suitable array of semiconductor chips embedded therein.

FIG. 1 illustrates a flow diagram of an embodiment of a method for fabricating at least one device. The method includes applying at least one semiconductor chip on a first form element (s1), applying at least one element on a second form element (s2), and applying a material on the at least one semiconductor chip and on the at least one element (s3).

The device to be fabricated can be, for example, an intermediate product or an end product. For example, the device can be a semiconductor chip module, for example, in the form of an embedded wafer or a reconstituted or re-configured wafer. For example, the device can also be a semiconductor chip package obtained, for example, by singulating a semiconductor chip module into a plurality of semiconductor chip packages.

According to one embodiment, the element applied to the second form element can be a further semiconductor chip, a via element, a resistor, a coil, a layer, a metal layer, a foil, a metal foil, a copper foil, a lead frame, a solder ball, a clip, a contact element, or a contact pad.

According to a further embodiment, the at least one semiconductor chip can be applied to a carrier layer, in one embodiment a first carrier layer, which is then applied to the first form element. Independently the at least one element can be applied to a carrier layer, in one embodiment a second carrier layer which is then applied to the second form element. The at least one semiconductor chip can be applied onto a main surface of the first carrier layer and the at least one element can be applied onto a main surface of the second carrier layer, and before applying the material, the first and second carrier layers can be positioned with respect to each other so that the main surfaces of the first and second carrier layers face each other.

According to a further embodiment, applying a material layer includes molding, in one embodiment transfer molding or compression molding. More specifically, in transfer molding the material can be applied on the at least one semiconductor chip and on the at least one element by introducing the material into a cavity formed by the first form element and the second form element. More specifically, in compression molding the material can be applied on the at least one semiconductor chip and on the at least one element by pressing the material between the first form element and the second form element.

According to a further embodiment, a mold apparatus can be provided, the mold apparatus having a lower mold tool and an upper mold tool, the semiconductor chip or the the first carrier layer can be placed on the lower mold tool and the element or the second carrier layer can be placed on the upper mold tool, and a mold material can be filled into an intermediate space between the lower and upper mold tools. In one embodiment, the lower and upper mold tools can be positioned relative to each other so that they form an inner cavity, the inner cavity containing the semiconductor chip and the element and, if present, the first and second carrier layers, and the mold material can be filled into the inner cavity.

According to a further embodiment, a plurality of first semiconductor chips are applied on the first form element and a plurality of second semiconductor chips are applied on the second form element. The number of the first semiconductor chips can be equal or unequal to a number of the second semiconductor chips.

According to a further embodiment, the first semiconductor chips and the second semiconductor chips can be applied such that one or more of the first semiconductor chips and one or more of the second semiconductor chips are placed opposite to each other, respectively, in the device to be fabricated, the device being, for example, a semiconductor chip module.

According to another embodiment, the first and second semiconductor chips can be applied such that one or more of the first semiconductor chips and one or more of the second semiconductor chips are placed in a side-by-side alternating manner.

FIGS. 2A-I illustrate schematic cross-section representations of intermediate products and devices together with process equipment for illustrating a further embodiment of a method for fabricating at least one device.

Figure 2B:

In FIG. 2A a schematic cross-section of an embodiment of a first carrier layer 1 is illustrated. The first carrier layer 1 can, for example, be made of any structural material like, for example, metal, plastic, ceramic, or of silicon, or of a polymer material. It can, for example, be of a rigid constitution so that it is stable and handable in itself. It may thus have a thickness of not less 200 μm. p FIG. 2B illustrates a schematic cross-section representation of an intermediate product wherein an adhesive foil 2 has been laminated onto the first carrier layer 1. The adhesive foil 2 can have double sided adhering properties and it can be releasable from the first carrier layer 1 or from any other layer or material onto which it has been applied.

The first carrier layer 1 may function as a release layer. In one embodiment, it may include a release system so that upon external predetermined conditions like, for example, heat or UV radiation, the adhesive foil 2 can be released from the first layer 1. The heat or UV radiation will be applied from the side of the first carrier layer 1 so that in case of the adhesive foil 2 being a thermal release foil the first carrier layer 1 needs not to be optically transparent whereas in case of the adhesive layer 2 being a UV light release tape, first carrier layer 1 should be optically transparent for UV radiation.

Figure 2C:
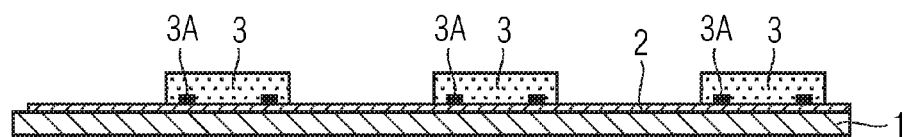

FIG. 2C illustrates a schematic cross-section representation of a further intermediate product in which semiconductor chips 3 have been placed onto the adhesive foil 2. The semiconductor chips 3 have undergone a test and have been found in order. Then, a conventional pick-and-place-machine can be used to place the semiconductor chips 3 onto the adhesive foil 2. The semiconductor chips 3 each include at least one contact pad 3A, respectively, wherein the contact pads 3A are respectively situated on a surface of the semiconductor chips 3 which is facing the adhesive layer 2. The semiconductor chips 3 are placed with a sufficient spacing in order to allow a fan-out of the electrical contacts as will be explained later.

Figure 2D:
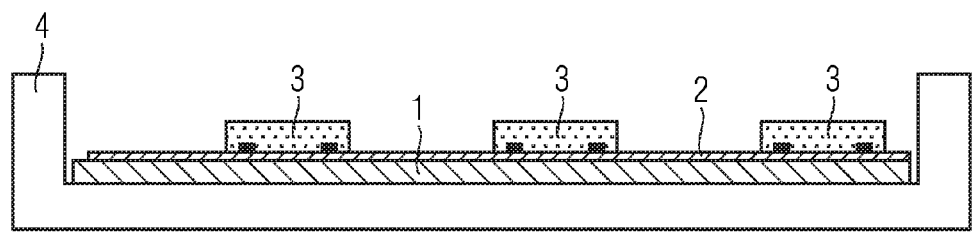

FIG. 2D illustrates a schematic cross-section representation of the intermediate product as illustrated in FIG. 2C which has been placed in a bottom tool 4 of a mold apparatus.

The bottom tool 4 of the mold apparatus can have the form and structure of a box including a cavity.

Figure 2E:
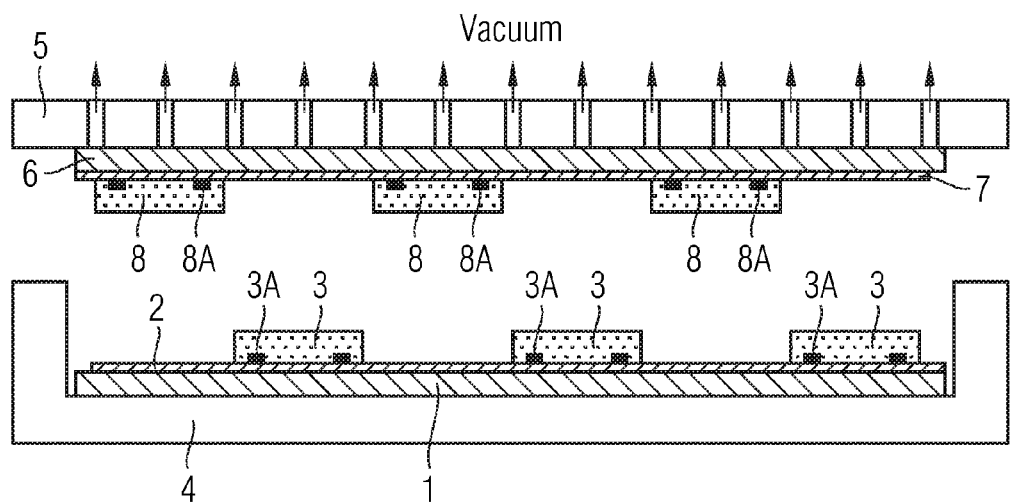

FIG. 2E illustrates a cross-section of the mold apparatus in operation. The lower part of the figure illustrates the bottom tool 4 as it was already illustrated in FIG. 2D. The upper part of the figure illustrates a top tool 5 of the mold apparatus. The top tool 5 carries a similar arrangement as that which was illustrated in FIG. 2C. This further arrangement consists of a second carrier layer 6 having applied thereon an adhesion layer 7 and second semiconductor chips 8 attached to the adhesion layer 7. The second semiconductor chips 8 are positioned so that they are laterally displaced from the first semiconductor chips 3 when the second carrier layer 6 is applied to the top tool 5 and the top tool 5 is connected with the bottom tool 4 in order to fabricate the semiconductor chip module. The second carrier layer 6 is fixed to the top tool 5 by using a vacuum mechanism which is principally known from conventional wafer chucks.

Figure 2F:
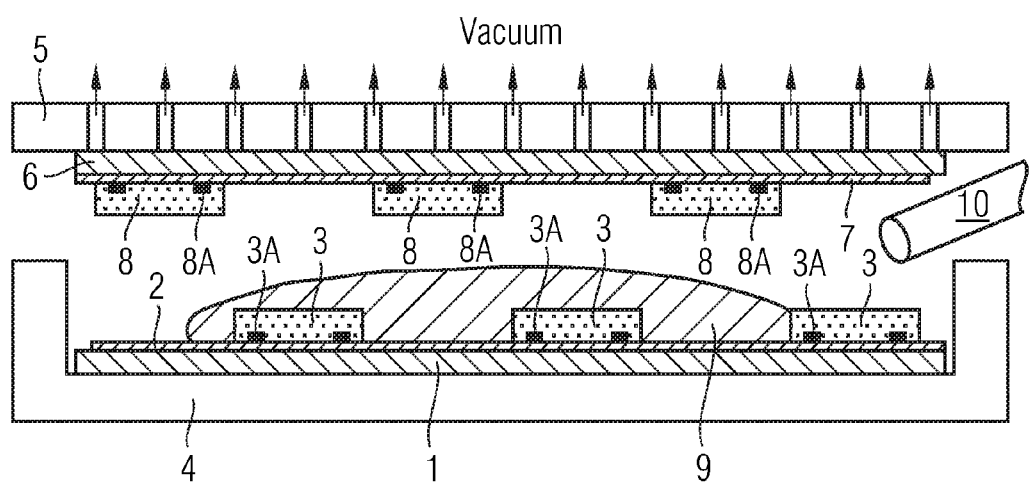

In FIG. 2F there is illustrated a schematic cross-section representation of the mold apparatus as depicted in FIG. 2E. In addition, it is illustrated how a mold medium 9 is filled into the cavity of the bottom tool 4. The mold medium 9 is filled in by using a dispense nozzle 10 which extends through an opening between the bottom tool 4 and the top tool 5. The molding technique which can be applied here can be a transfer molding technique or a compression molding technique. The potential molding materials include, for example, aliphatic and aromatic polymers including thermoplastic and thermoset type polymers and blends of these polymers and also other various types of polymers.

Figure 2G:
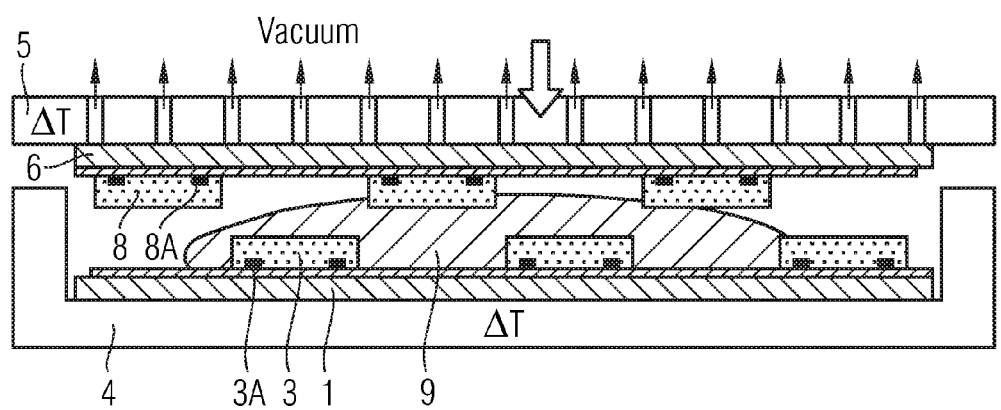

In FIG. 2G there is illustrated a schematic cross-section representation of the mold apparatus as already illustrated in FIGS. 2E and 2F. In addition, it is illustrated in FIG. 2G how the top tool 5 is moved downwards to come into a fixed connection with the bottom tool 4. During this operation the mold medium 9 is compressed and distributed as it is displaced by the down-moving second semiconductor chips 8 and the main surface of the second carrier layer 6. The symbol ΔT indicates that in addition a predetermined amount of heat can be supplied to the bottom tool 4 and the top tool 5.

Figure 2H:
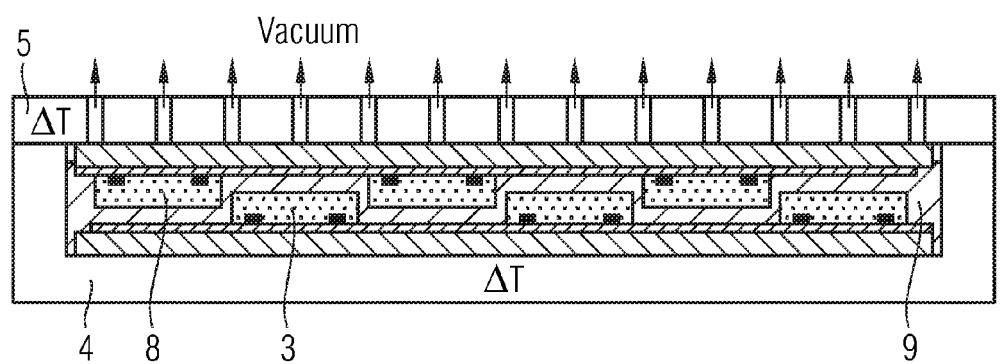

In FIG. 2H a situation is illustrated in which the top tool 5 is in a fixed connection with the bottom tool 4 and the mold medium 9 has distributed along the entire length of the first carrier layer 1 and the second carrier layer 6 and the mold medium 9 has covered the first semiconductor chips 3 and the second semiconductor chips 8 and the main surfaces of the first carrier layer 1 and the second carrier layer 6 facing each other.

Figure 2I:
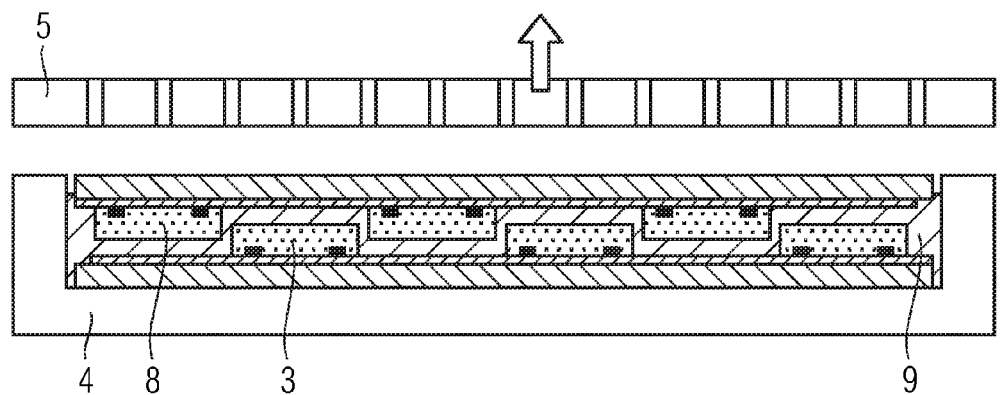

Afterwards a curing process is conducted for hardening the mold medium 9 so that it becomes a rigid material layer. In FIG. 2I it is illustrated that after the curing process the top tool 5 is lifted off from the bottom tool 4. In further processes, which are not illustrated here, the cured and hardened mold layer 9 is released from the bottom tool 4 and the first carrier layer 1 and the second carrier layer 6 are de-laminated from the cured and hardened mold layer 9 having the first semiconductor chips 3 and the second semiconductor chips 8 embedded therein.

In FIGS. 3A-D there are illustrated cross-section representations of different embodiments of fabricated devices in the form of semiconductor chip modules. All these embodiments illustrate a cured and hardened mold material layer 9, first semiconductor chips 3 and second semiconductor chips 8. In all these embodiments the first semiconductor chips 3 and the second semiconductor chips 8 have a main surface, respectively, where contact pads 3A and 8A are arranged. Also in all these embodiments the main surfaces of the first semiconductor chips 3 are flash or coplanar with an upper surface of the mold material layer 9 and the main surfaces of the second semiconductor chips 8 are flash or coplanar with a lower surface of the mold material layer 9.

Figure 3A:
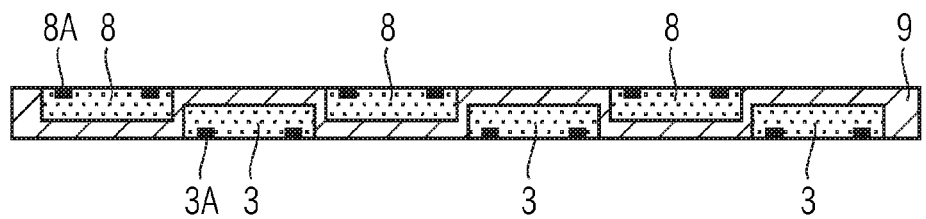
FIGS. 3A-D illustrate schematic cross-section representations of different embodiments of devices fabricated according to further embodiments of a method for fabricating at least one device.

FIG. 3A illustrates an embodiment in which the first semiconductor chips 3 and the second semiconductor chips 8 are placed in a side-by-side alternating manner. In this embodiment the mold material layer 9 can be relatively thin as in each lateral position of the mold material layer 9 there is at maximum only one semiconductor chip, i.e. either a first semiconductor chip 3 or a second semiconductor chip 8.

Figure 3B:
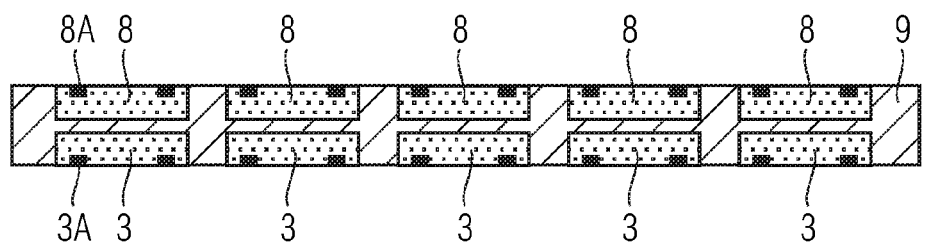

In FIG. 3B there is illustrated an embodiment in which the first semiconductor chips 3 and the second semiconductor chips 8 are placed opposite to each other, respectively. In this embodiment the mold material layer 9 is relatively thick as there are lateral positions of the mold material layer 9 in which two semiconductor chips, namely one of the first semiconductor chips 3 and one of the second semiconductor chips 8, are stacked directly above one another.

Figure 3C:
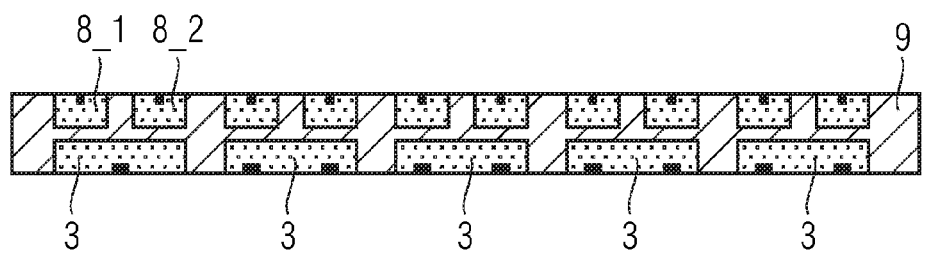

In the embodiments of FIGS. 3A, B the number of the first semiconductor chips 3 is equal to the number of the second semiconductor chips 8. In FIG. 3C there is illustrated an embodiment in which the number of the first semiconductor chips 3 is different from the number of the second semiconductor chips 8_1, 8_2. In one embodiment, in the embodiment as illustrated in FIG. 3C, the number of the second semiconductor chips 8_1, 8_2 is twice as that of the number of the first semiconductor chips 3. More specifically, in the embodiment of FIG. 3C above each one of the first semiconductor chips 3 two second semiconductor chips 8_1, 8_2 are placed.

Figure 3D:
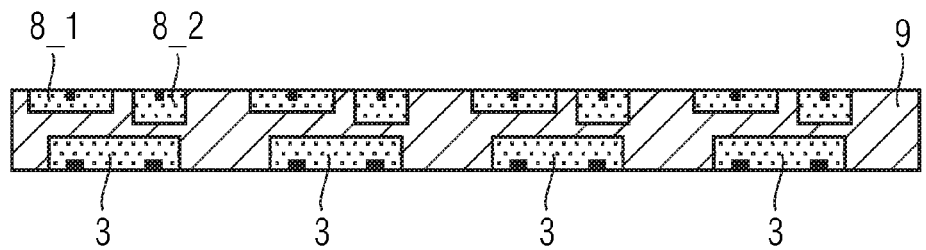

In FIG. 3D there is illustrated an embodiment of a semiconductor chip module similar to the embodiment as illustrated in FIG. 3C. In the embodiment of FIG. 3D the two second semiconductor chips 8_1, 8_2 being placed above one first semiconductor chip 3 have different vertical extension.

Figure 4:
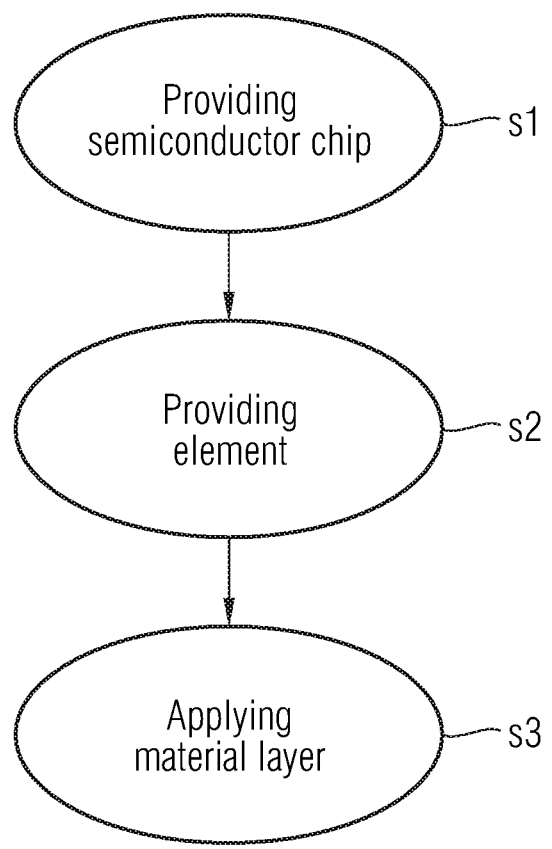
FIG. 4 illustrates a flow diagram of a further embodiment of a method for fabricating at least one device.

FIG. 4 illustrates a flow diagram of a further embodiment of a method for fabricating at least one device. The method includes providing at least one semiconductor chip (s1), providing at least one element (s2), applying a material layer on the at least one semiconductor chip and on the least one element, the material layer including a first surface and a second surface opposite to the first surface, wherein the first surface of the material layer is coplanar with a surface of the at least one semiconductor chip and the second surface of the material layer is coplanar with a surface of the at least one element (s3).

In FIGS. 5A-F there are illustrated cross-section representations of intermediate products and devices for illustrating a further embodiment illustrated in FIGS. 1, 2A-I, 3A-D, and 4.

Figure 5A:
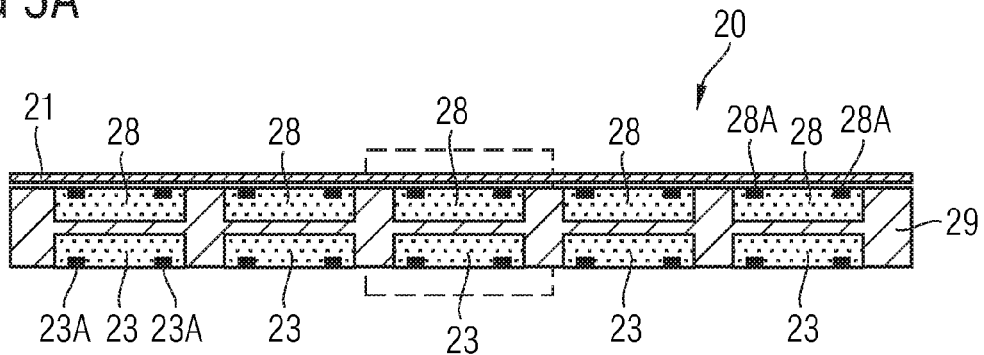
FIGS. 5A-F illustrate schematic cross-section representations of intermediate products and devices for illustrating a further embodiment as illustrated in FIGS. 1, 2A-I, 3A-D, and 4.

In FIG. 5A a device in the form of a semiconductor chip module 20 is illustrated fabricated according to the method as illustrated in one of the embodiments of FIGS. 1 to 4. In the following, in FIGS. 5B to F only a part of the semiconductor chip module 20 is illustrated in cross-section, which part is to become a semiconductor chip package which is to be cut out of the semiconductor chip module 20 in the later process. For the first processing steps the semiconductor chip module 20 can be covered with an adhesive foil 21 in order to protect a side of the semiconductor chip module 20 which is not going to be processed. The semiconductor chip module 20 includes a mold layer 29, first semiconductor chips 23 and second semiconductor chips 28, wherein each one of the first semiconductor chips 23 is placed directly opposite one of the second semiconductor chips 28. The first semiconductor chips 23 each include two first contact pads 23A, respectively, and the second semiconductor chips 28 each include two second contact pads 28A.

In FIGS. 5B -F there are illustrated processes for applying a plurality of contact elements on one side of the mold material layer 29, and for connecting the contact elements with selected ones of the first or second contact pads 23A and 28A, respectively.

Figure 5B:
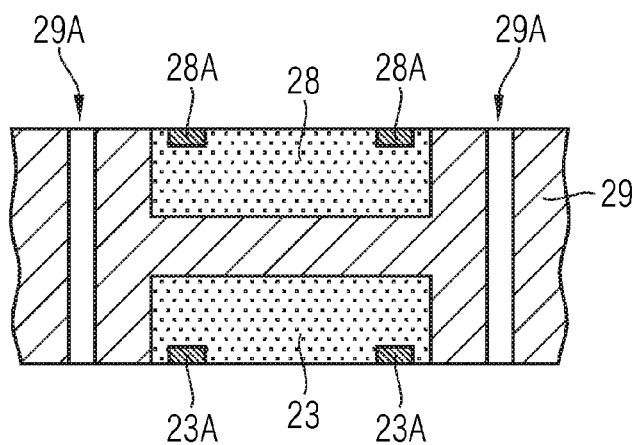
Figure 5C:
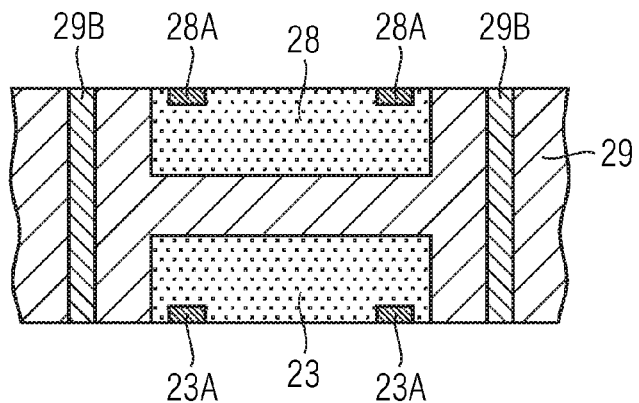

In FIGS. 5B, C there is illustrated a first process in which electrical via connections are formed through the material layer 29. According to FIG. 5B through holes 29A are formed in the material layer 29 by laser drilling. The through holes 29A reach from the lower surface to the upper surface of the material layer 29. According to FIG. 5C the through holes 29A are filled with an electrically conducting material thus forming electrical via connections 29B. This can be done, for example, by a plating process and/or a sputtering process. Alternatively a printing process can be applied. As a further possibility conductive ink can be filled into the through holes 29A.

The electrical via connections can also be placed before applying the mold material layer 5 between the semiconductor chips 23 and 28. Therefore conductive posts of polymer or metal (e.g., copper), solder balls or columns or other conductive material can be placed between the semiconductor chips 23 and 28, for example, by connecting them to one of carrier layers 1 or 6, prior to molding. The vias connections are then embedded in the mold compound together with the semiconductor chips 23 and 28. By backgrinding the top of the via connections can be cleaned from mold material and exposed and can then be used as via connections between semiconductor chips disposed on either sides of the mold material layer 5.

Figure 5D:
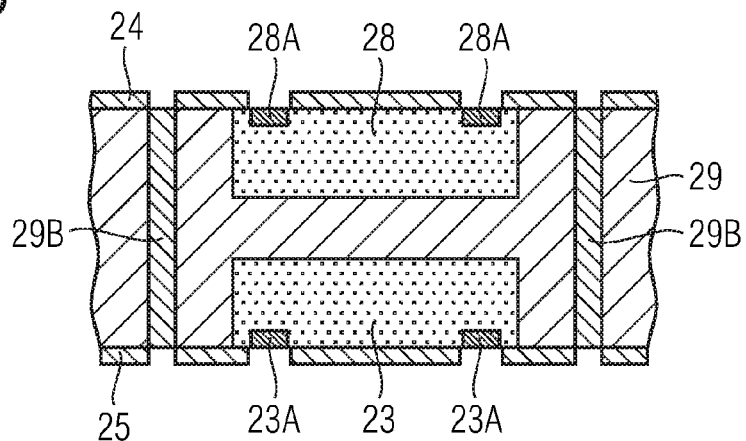

According to FIG. 5D, dielectric layers 24 and 25 are deposited onto the lower surface and the upper surface of the material layer 29, respectively. The dielectric layers 24 and 25 can be deposited onto the lower and upper surfaces of the mold layer 29 by using a spin-on technique. In the dielectric layers 24 and 25 openings are formed at the contact pads 23A and 28A and the electrical via connections 29B.

Figure 5E:
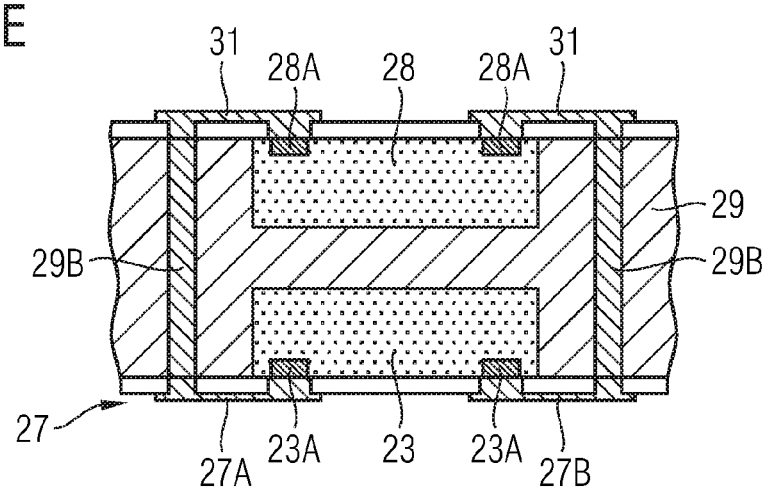

In FIG. 5E the structure is illustrated after a process in which the openings in the dielectric layers 24 and 25 are filled with an electrically conducting material. On the lower surface of the material layer 29 a redistribution layer 27 is deposited, the redistribution layer 27 consisting of redistribution pads 27A, B. Each one of the redistribution pads 27A, B is connected with one of the contact pads 23A of the first semiconductor chip 23, respectively. The redistribution pads 27A, B serve the purpose to redistribute the surface area of the contact pads 28A, respectively, so that an external contact element 30 can be connected as will be illustrated later. In FIG. 5E it is also illustrated that the redistribution pads 27A, B are connected through the electrical via connections 29B and bridge layers 31 to the second contact pads 28A of the second semiconductor chip 28. This form of representation is only for reasons of simplicity. In fact the first contact pads 23A would have to be connected to redistribution pads as illustrated in principle, but would be connected to other redistribution pads of the redistribution layer 27.

Figure 5F:
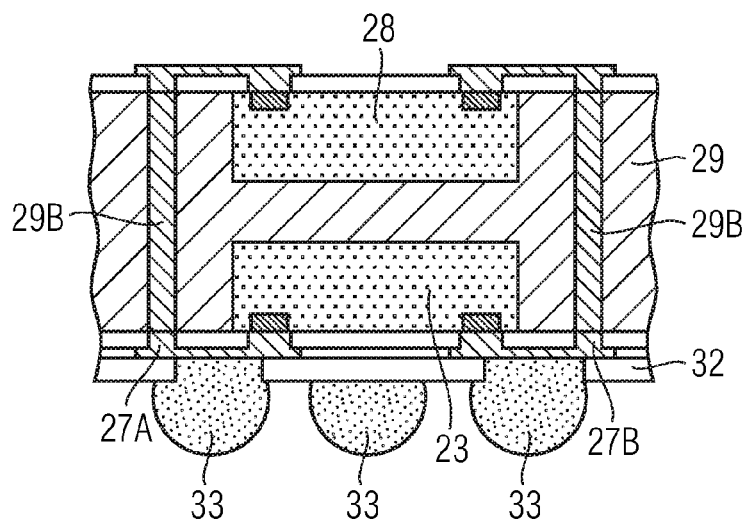

In FIG. 5F the structure is illustrated after the application of a solder stop layer or solder resist layer 32. After application of the solder stop layer 32 2 5 openings are formed in the solder stop layer 32 to make openings to the redistribution pads 27A, 27B. Afterwards, solder balls 33 are filled into the openings of the solder stop layer 32.

It is to be noted that the other sections of the semiconductor chip module of FIG. 5A are fabricated in a similar way as described above. In the last process the semiconductor chip module 20 is singulated into a plurality of semiconductor chip packages such as that illustrated in FIG. 5F.

Figure 6:
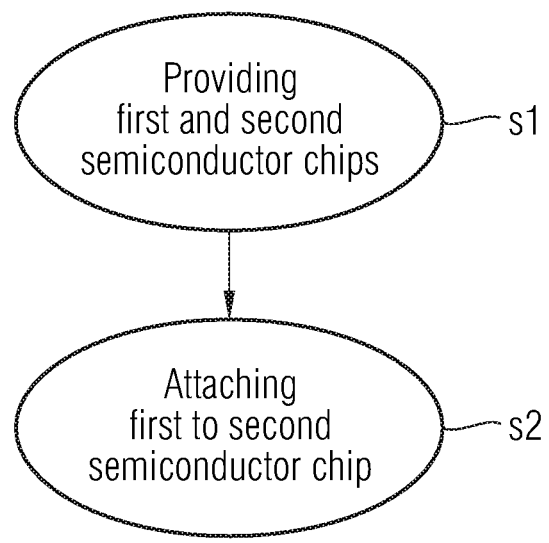
FIG. 6 illustrates a flow diagram of an embodiment of a method for fabricating a semiconductor chip assembly.

FIG. 6 illustrates a flow diagram of an embodiment of a method for fabricating a semiconductor chip assembly. The method includes providing a first semiconductor chip and a second semiconductor chip (s1), and attaching the first semiconductor chip to the second semiconductor chip by using an adhesion layer (s2).

Figure 7A:
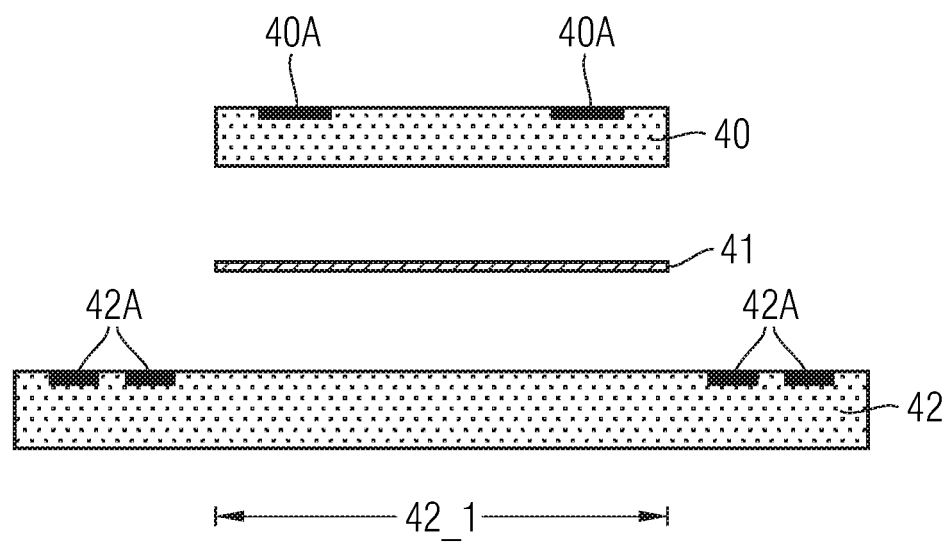
FIGS. 7A, B illustrate schematic cross-section representations of intermediate products and a semiconductor chip assembly for illustrating a further embodiment of the embodiment as illustrated in FIG. 6.

In FIGS. 7A, B a further embodiment for fabricating a semiconductor chip assembly is illustrated. FIG. 7A illustrates cross-section representations of a first semiconductor chip 40, an adhesive layer 41, and a second semiconductor chip 42, respectively. The first semiconductor chip 40 includes contact pads 40A at an upper surface thereof. The adhesive layer 41 is applied to a lower surface of the first semiconductor chip 40. The second semiconductor chip 42 also includes contact pads 42A at an upper surface thereof. The contact pads 42A are located outside of a center region 42_1 of the upper surface of the second semiconductor chip 42 so that the first semiconductor chip 40 and the adhesive layer 41 applied to the lower surface of the first semiconductor chip 40 can be attached to the upper surface of the second semiconductor chip 42 within the center region 42_1.

Figure 7B:
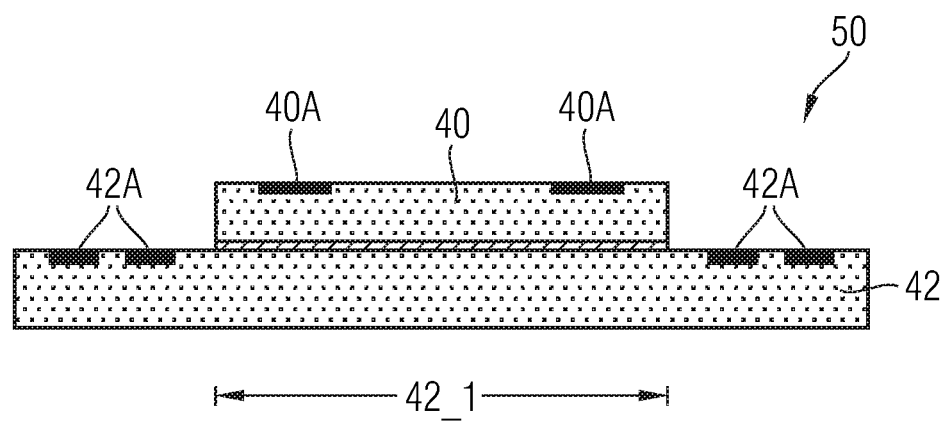

FIG. 7B illustrates the fabricated semiconductor chip assembly 50.

FIG. 8 illustrates a cross-section representation of a semiconductor chip package fabricated, for example, according to one or more of the embodiments as outlined above in connection with FIGS. 1 to 7 or one or more features disclosed in these embodiments. In addition, the semiconductor chip package 60 as illustrated in FIG. 8 includes two semiconductor chip assemblies as fabricated according to FIGS. 6 and 7. The two semiconductor chip assemblies are designated as 51 and 52. A first semiconductor chip assembly 51 includes a first semiconductor chip 51_2 and a second semiconductor chip 51_1. A second semiconductor chip assembly 52 includes as well a first semiconductor chip 52_2 and a second semiconductor chip 52_1.

The semiconductor chip module 60 includes a material layer 69 wherein the two semiconductor chip assemblies 51 and 52 are embedded such that the surfaces of the respective smaller semiconductor chips 51_2 and 52_2 are flush or coplanar with one of the surfaces of the material layer 69, respectively. The contact pads of the semiconductor chips are connected via bridge pads or redistribution pads to contact elements 63 applied as was explained in connection with FIG. 5F.

FIGS. 9A-F illustrate schematic cross-section representations of intermediate products and devices together with process equipment for illustrating a further embodiment for fabricating at least one device.

According to this embodiment, semiconductor chips 3 are applied to a first form element 4 in the same way as in the embodiment according to FIG. 2A-I, wherein the first form element 4 can be a lower mold tool of a mold apparatus. However, according to this embodiment, electrical contact elements 18 are applied to the second form element 5. The electrical contact elements 18 can be made of any electrically conductive material such as, for example, metal (e.g., copper) or polymer material. They can have the form of posts, solder balls or columns or any other form of elevations.

According to FIG. 9A, a similar configuration is illustrated as that in FIG. 2F. The semiconductor chips 3 are applied to a first carrier layer 1 which itself is applied to the lower mold tool 4 of the mold apparatus. The electrical contact elements 18 are applied to a second carrier layer 16 which itself is applied to the upper mold tool 5 of the mold apparatus. The second carrier layer 16 can be made of an electrically conductive material for reasons to be explained later. It can, however, also be made of any other material as the carrier layer 6 of the embodiment of FIGS. 2A-I.

According to FIG. 9B, a similar configuration is illustrated as that in FIG. 2I. The mold material 9 has distributed along the device and the upper mold tool 5 has already been removed.

According to FIG. 9B, the lower mold tool 4 and the first carrier layer 1 have been removed.

According to FIG. 9D, through holes 9A have been formed into the mold material layer 9. The through holes 9A can be formed by laser drilling, for example.

According to FIG. 9E, the through holes 9A have been filled with an electrically conductive material to form through conductors 9B. This can be done, for example, by a plating process wherein the electrically conductive second carrier layer 6 can be used as an electrode. However, the through holes 9A can also be filled by other means. For example, the through holes 9A can also be filled with conductive ink to form the through conductors 9B, in which case the second carrier layer 6 needs not to be an electrically conductive layer.

According to FIG. 9F, the second carrier layer 16 has been removed. In the following, a standard process for fabricating a redistribution layer can be conducted. In one embodiment, on the lower surface of the mold material layer 9, the contact pads 3A of the semiconductor chip 3 can be connected with the bottom portion of the through conductors 9B, respectively. On the upper surface of the mold material layer 9, a redistribution layer including redistribution pads or traces can be formed and these redistribution pads or traces can be connected to solder balls, for example. Alternatively, if the second carrier layer 16 is an electrically conductive layer, the second carrier layer 16 may not be removed between the states of FIGS. 9E and 9F and instead the second carrier layer 16 can be made to be the redistribution layer.

FIGS. 10A, B illustrate schematic cross-section representations of intermediate products and devices together with process equipment for illustrating a further embodiment for fabricating at least one device.

According to this embodiment, semiconductor chips 3 are applied to a first form element 4 in the same way as in the embodiment according to FIG. 2A-I, wherein the first form element 4 can be a lower mold tool of a mold apparatus. However, according to this embodiment, electrical contact elements 38 are applied to the second form element 5. The electrical contact elements 38 are relatively long contact elements as compared to the electrical contact elements 18 as of the embodiment of FIGS. 9A-F.

According to FIG. 10A, a similar configuration is illustrated as that in FIG. 2F. The semiconductor chips 3 are applied to a first carrier layer 1 which itself is applied to the lower mold tool 4 of the mold apparatus. The electrical contact elements 38 can be applied to a second carrier layer 6 which itself is applied to the upper mold tool 5 of the mold apparatus. The electrical contact elements 38 can be made of any electrically conductive material such as, for example, metal (e.g., copper) or polymer material. They can have the form of posts, solder balls or columns or any other form of elevations.

According to FIG. 10B, the upper mold tool 5 has been removed. The second carrier layer can be removed as with the embodiment according to FIGS. 9A-F. However, alternatively, if the second carrier layer 66 is an electrically conductive layer, the second carrier layer 6 may not be removed after the state of FIG. 10B and instead the second carrier layer 6 can be made to be the redistribution layer.

The electrical contact elements 38 are illustrated so that they do not reach through the mold material layer 9 completely so that for connecting them to the contact pads 3A, respectively, openings aligned with the electrical contact elements 38 will have to be formed into the mold material layer 9. However, the electrical contact elements 38 can also have a length corresponding to the thickness of the mold material layer 9 so that they will reach through the mold material layer 9.

FIGS. 11A-C illustrate schematic cross-section representations of intermediate products and devices for illustrating a further embodiment for fabricating at least one device.

According to this embodiment, semiconductor chips 3 are applied to a first form element 4 in the same way as in the embodiment according to FIG. 2A-I, wherein the first form element 4 can be a lower mold tool of a mold apparatus. However, according to this embodiment, an electrically conductive layer 48 is applied to the second form element 5. In addition, the electrically conductive layer 48 may have been applied to a second carrier layer 6 such as that illustrated in previous embodiments.

According to FIG. 11A, the upper and lower mold tools 4 and 5 have already been removed and also possible first and second carrier layer 1 and 6 have been removed.

According to FIG. 11B, through holes 9A are formed into the mold material layer 9 as it was described above.

According to FIG. 11C, the electrically conductive layer 48 is made to be a redistribution layer having redistribution pads or traces 48A at least some of them lying above the through holes 9A. Beforehand the electrically conductive layer 48 can be thinned by, for example, etching back. Before or after processing the electrically conductive layer 48 to become a redistribution layer, the through holes 9A can be filled with an electrically conductive material as was explained above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A semiconductor chip assembly, comprising:
    a first semiconductor chip;
    a second semiconductor chip, wherein the first and second semiconductor chips are attached to one another by using an adhesion layer, wherein the first and second semiconductor chips each comprise a main surface having contact pads thereon and a back surface, and wherein the back surface of the first semiconductor chip is attached to the main surface of the second semiconductor chip; and
    a mold material embedding the first and the second semiconductor chip, wherein the main surface of the first semiconductor chip and a surface of the mold material together form a coplanar surface;
    a redistribution wiring layer disposed on the coplanar surface, the contact pads of the first and second semiconductor chips electrically connected to the redistribution wiring layer.

2. The semiconductor chip assembly of claim 1, wherein the first semiconductor chip is smaller than the second semiconductor chip.

3. The semiconductor chip assembly of claim 1, wherein:
the redistribution wiring layer includes a plurality of redistribution pads via which contact pads of the first and the second semiconductor chips are connected to contact elements.

4. The semiconductor chip assembly of claim 3, wherein the contact elements are solder balls arranged on the redistribution pads.

5. The semiconductor chip assembly of claim 1, further comprising:
a third semiconductor chip; and
a fourth semiconductor chip, wherein the third and the fourth semiconductor chip are attached to one another by using a further adhesion layer.

6. The semiconductor chip assembly of claim 5, wherein:
the third and the fourth semiconductor chip each comprise a main surface having contact pads thereon and a back surface; and
wherein the back surface of the third semiconductor chip is attached to the main surface of the fourth semiconductor chip.

7. A semiconductor chip assembly, comprising:
a first semiconductor chip;
a second semiconductor chip, wherein the first and second semiconductor chips each comprise a main surface having contact pads thereon and a back surface, and wherein the back surface of the first semiconductor chip is attached to the main surface of the second semiconductor chip using an adhesion layer;
a third semiconductor chip;
a fourth semiconductor chip, wherein the third and the fourth semiconductor chip each comprise a main surface having contact pads thereon and a back surface, and wherein the back surface of the third semiconductor chip is attached to the main surface of the fourth semiconductor chip using a further adhesion layer: and
a mold material embedding the first, second, third, and fourth semiconductor chips with the back surfaces of the second and fourth semiconductor chips facing one another and spaced apart and separated from one another by the mold material, wherein the main surface of the first semiconductor chip is coplanar with a first major surface of the mold material and the main surface of the third semiconductor chip is coplanar with a second major surface of the mold material, the second major surface opposite the first major surface.

8. The semiconductor chip assembly of claim 1, further comprising:
at least one of a via connection or a redistribution pad formed coupling a contact pad of at least one of the first or the second semiconductor chip to a contact element.

9. The semiconductor chip assembly of claim 8, wherein the contact element is a solder ball arranged over a surface of the mold material.

* * * * *